(12) United States Patent
Carroll et al.

(10) Patent No.: US 12,382,832 B2
(45) Date of Patent: Aug. 5, 2025

(54) THERMOELECTRIC PIEZOELECTRIC GENERATOR

(71) Applicant: Wake Forest University, Winston-Salem, NC (US)

(72) Inventors: David L. Carroll, Winston-Salem, NC (US); David Montgomery, Winston-Salem, NC (US)

(*) Notice: Subject to any disclaimer, the term of this patent is extended or adjusted under 35 U.S.C. 154(b) by 86 days.

(21) Appl. No.: 16/083,122

(22) PCT Filed: Mar. 9, 2017

(86) PCT No.: PCT/US2017/021613
§ 371 (c)(1),
(2) Date: Sep. 7, 2018

(87) PCT Pub. No.: WO2017/156296
PCT Pub. Date: Sep. 14, 2017

(65) Prior Publication Data
US 2019/0103539 A1     Apr. 4, 2019

Related U.S. Application Data

(60) Provisional application No. 62/305,852, filed on Mar. 9, 2016.

(51) Int. Cl.
H10N 10/17     (2023.01)
H10N 30/30     (2023.01)

(52) U.S. Cl.
CPC ............ *H10N 10/17* (2023.02); *H10N 30/30* (2023.02)

(58) Field of Classification Search
None
See application file for complete search history.

(56) References Cited

U.S. PATENT DOCUMENTS

| | | | |
|---|---|---|---|
| 2009/0025773 A1 | 1/2009 | Stark | |
| 2011/0220162 A1* | 9/2011 | Siivola | H01L 35/32 136/203 |
| 2011/0226304 A1* | 9/2011 | Hayashi | H01L 35/32 136/238 |
| 2012/0133210 A1 | 5/2012 | Moon et al. | |
| 2012/0274178 A1* | 11/2012 | Ochi | H01L 41/29 310/311 |
| 2012/0313887 A1* | 12/2012 | Chen | G06F 3/044 345/174 |

(Continued)

FOREIGN PATENT DOCUMENTS

WO     2016196318 A1     12/2016

OTHER PUBLICATIONS

International Search Report and Written Opinion corresponding to PCT/US2017/021613, mailed May 18, 2017, 8 pages.

*Primary Examiner* — Daniel P Malley, Jr.

(74) *Attorney, Agent, or Firm* — Patent Grove AB; Tomas Friend

(57) ABSTRACT

Electric generators are described herein integrating thermoelectric and piezoelectric components. In some embodiments, an electric generator comprises a thermoelectric film having a plurality of lateral p-n junctions across a face of the film, the lateral p-n junctions established at interfaces between p-type regions and n-type regions. A piezoelectric film is coupled to the thermoelectric film and an electrode is coupled to the piezoelectric film.

21 Claims, 4 Drawing Sheets

(56) References Cited

U.S. PATENT DOCUMENTS

| | | | |
|---|---|---|---|
| 2013/0020909 A1* | 1/2013 | Kim | H02N 2/18 |
| | | | 310/339 |
| 2014/0174496 A1* | 6/2014 | Park | H02N 2/186 |
| | | | 977/948 |
| 2014/0190542 A1* | 7/2014 | Lane | H01L 27/16 |
| | | | 136/212 |
| 2014/0338715 A1* | 11/2014 | Grunlan | H01L 35/22 |
| | | | 136/205 |
| 2015/0342523 A1* | 12/2015 | Baik | A61B 5/6801 |
| | | | 600/595 |
| 2016/0035956 A1 | 2/2016 | Carroll et al. | |

* cited by examiner

THERMOELECTRIC PIEZOELECTRIC GENERATOR

RELATED APPLICATION DATA

This application is a U.S. National Phase of PCT/US2017/021613, filed Mar. 9, 2017. which claims priority pursuant to 35 U.S.C. § 119(e) to U.S. Provisional Patent Application Ser. No. 62/305,852 filed Mar. 9, 2016, each of which is incorporated herein by reference in its entirety.

STATEMENT OF GOVERNMENT RIGHTS

This invention was made with government support under Grant No. FA 9550-13-1-0085 awarded by the Air Force Office of Scientific Research. The government has certain rights in the invention.

FIELD

The present invention relates to electric generators and, in particular, to electric generators integrating flexible thermoelectric and piezoelectric components into a single device architecture.

BACKGROUND

Thermoelectric and piezoelectric generators are generally incompatible because each uses a vastly different method to couple to their respective energy sources. For example, when a thermoelectric generator (TEG) is exposed to a thermal gradient, a voltage is generated due to the Seebeck effect. When each thermoelectric element maintains the maximum thermal gradient, the TEG achieves optimal performance. Alternatively, since mechanical deformation of a piezoelectric material creates a potential between the generated bound surface charge, piezoelectric generators (PEG) need to mechanically couple to dynamic systems to harvest energy. Due to this mismatch between heat and mechanical source coupling, TEGs are typically designed to be rigid and static while PEGs are flexible and dynamic making them incompatible with one another, even though the main target systems exhibit both waste thermal and mechanical energy.

In addition to the different coupling mechanisms, TEGs and PEGs are destructive to one another because of the mismatch in voltage signal. Under static thermal gradients, TEGs generate DC voltages and are essentially low value resistive elements. Alternatively, dielectric PEGs under dynamic stress generate AC voltages and are capacitive in nature. The combination of these elements negates the power production of the other, depending on arrangement. For example, by placing a TEG and PEG electrically in parallel, the low resistance TEG will discharge the PEG capacitor thereby causing only the TEG to generate power. Alternatively, if the TEG and PEG are placed electrically in series, the capacitor creates an open circuit dramatically decreasing the power output of the TEG.

SUMMARY

In view of these technical problems and incompatibilities, electric generators are described herein which efficiently integrate thermoelectric and piezoelectric components into a single device architecture. Briefly, an electric generator described herein comprises a thermoelectric film having a plurality of lateral p-n junctions across a face of the film, the lateral p-n junctions established at interfaces between p-type regions and n-type regions. A piezoelectric film is coupled to the thermoelectric film and an electrode is coupled to the piezoelectric film. In some embodiments, the electric generator adopts a sandwich structure wherein the piezoelectric film is positioned between the thermoelectric film and electrode. Further, the thermoelectric film can be folded at the p-n junctions. In such embodiments, the electric generator can have a corrugated structure or orientation.

These and other embodiments are described further in the following detailed description.

DETAILED DESCRIPTION

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

Figure 1A:
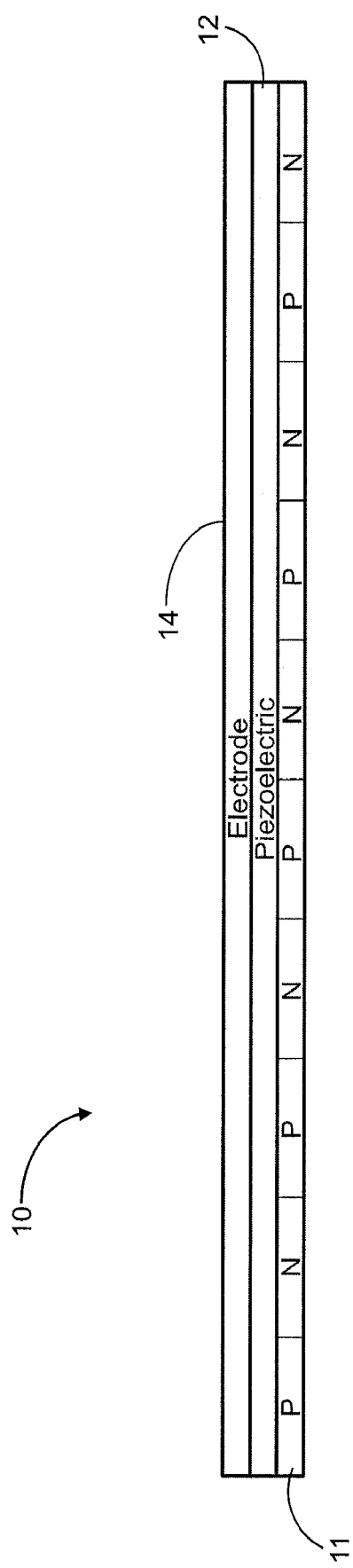
FIG. 1(a) illustrates construction of an electric generator according to some embodiments described herein.
Figure 1B:
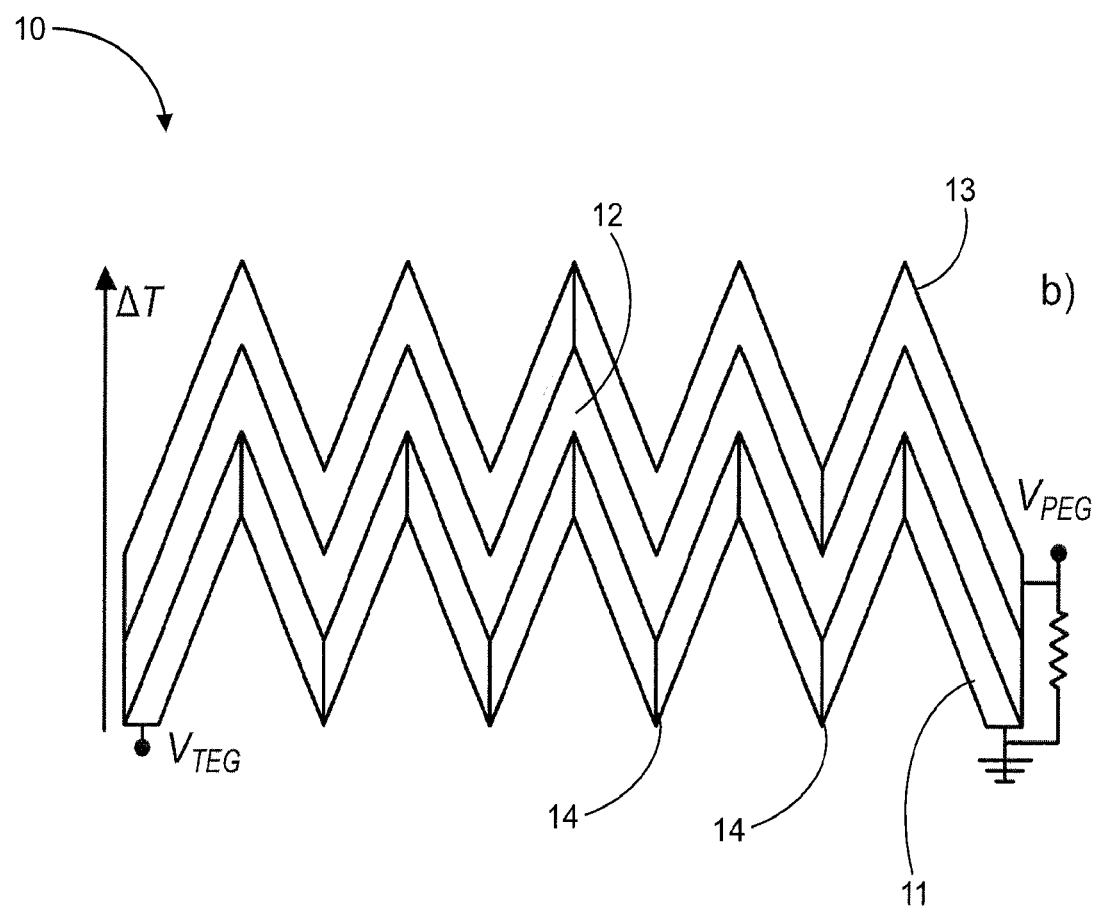
FIG. 1(b) illustrates an electric generator in a folded or corrugated orientation according to some embodiments described herein.

Electric generators are described herein integrating thermoelectric and piezoelectric components. In some embodiments, an electric generator comprises a thermoelectric film having a plurality of lateral p-n junctions across a face of the film, the lateral p-n junctions established at interfaces between p-type regions and n-type regions. A piezoelectric film is coupled to the thermoelectric film and an electrode is coupled to the piezoelectric film. FIGS. 1(a)-(b) illustrate an electric generator according to some embodiments described herein. As illustrated in FIG. 1(a), a piezoelectric film or layer 12 is coupled to a thermoelectric film or layer 11. The thermoelectric film 11 includes a plurality of lateral p-n junction across the film 11. An electrode 13 is coupled to the piezoelectric film. Referring now to FIG. 1(b), the thermoelectric film 11 can be folded at the p-n junctions 14, placing the electric generator 10 in a corrugated orientation. Folding the thermoelectric film 11 and associated piezoelectric film 12 and electrode 13 allows for a thermal gradient (ΔT) to be established across the thickness of the electric generator 10. Thermoelectric voltage is measured between the opposite sides of the electrode 13, and piezoelectric voltage is measured between the electrode 13 and thermoelectric film 11. In the embodiment of FIG. 1(b), the thermoelectric film 11 can serve as an electrode that provides a capacitive structure with the back electrode 13 for extracting piezoelectric voltage resulting from mechanical deformation of the piezoelectric film 12.

Turning now to specific components, the electric generator comprises a thermoelectric film or layer having a plurality of lateral p-n junctions across a face of the film, the lateral p-n junctions established at interfaces between p-type regions and n-type regions. The p-type regions and n-type regions can be formed of any materials not inconsistent with the objectives of the present invention. As detailed further herein, the p-type regions and n-type regions can comprise organic materials, inorganic materials or various combinations thereof.

In some embodiments, the p-type regions comprise conductive particles dispersed in or on a first carrier. Electrically conductive particles of the p-type regions can include p-type organic nanoparticles, p-type inorganic nanoparticles or mixtures thereof. In some embodiments, p-type nanoparticles are selected from the group consisting of nanotubes, nanowires, nanorods, platelets and sheets. The p-type nanoparticles can have a 1-dimensional or 2-dimensional structure, in some embodiments.

P-type organic nanoparticles can include carbon nanotubes, fullerenes, graphene or mixtures thereof. In some embodiments, lattice structures of the organic p-type nanoparticles include one or more dopants such as boron. Alternatively, p-type dopant is externally applied to the organic nanoparticles by the environment surrounding the nanoparticles in the first carrier. For example, the first carrier can provide p-dopant to surfaces of the organic nanoparticles. Similarly, one or more p-dopant species can be dispersed in the first carrier for interaction with the organic nanoparticles.

P-type inorganic nanoparticles can include binary, ternary and quaternary semiconductor compositions formed from elements selected from Groups IB, IIB and IIIA-VIA of the Periodic Table. For example, p-type inorganic nanoparticles can be formed of $Cu_{2-x}Te$, $Cu_{2-x}Se$, $Sb_2Te_3$, $Ag_2Se$, $Ag_2Te$, $Cu_2Te$, $Cu_2Se$, Se or Te. P-type inorganic nanoparticles can also be selected from various transition metal dichalcogenides, $MX_2$, where M is a transition metal and X is a chalcogen. Table I provides non-limiting examples of p-type inorganic nanoparticles and morphology.

TABLE I

P-type Inorganic Nanoparticles

| Nanoparticle Composition | Morphology |
| --- | --- |
| $Cu_{2-x}Te$ | Nanowires |
| $Cu_{2-x}Se$ | Nanowires |
| $Sb_2Te_3$ | Nanoplatelets |
| Te | Nanorods |
| $Ag_2Se$ | 1D Nanowire |
| $Ag_2Te$ | 1D Nanowire |
| $Cu_2Te$ | 1D Nanowire |
| $Cu_2Se$ | 1D Nanowire |
| Se | 1D Nanowire |
| Te | 1D Nanowire |

In some embodiments, p-dopant is externally applied to inorganic nanoparticles by the first carrier and/or one or more p-dopant species dispersed in the first carrier. For example, the inorganic nanoparticles can be sufficiently thin that electronic properties of the nanoparticles are dominated by surface behavior and surface interactions. The inorganic nanoparticles can lack sufficient thickness to exhibit any meaningful bulk properties. Therefore, p-dopant species externally applied to the inorganic nanoparticles can create the p-type character of the nanoparticles. In some embodiments, the inorganic nanoparticles of the p-type region are one or more topological insulators.

P-type organic nanoparticles and/or inorganic nanoparticles can be present in the first carrier in any amount not inconsistent with the objectives of the present invention. In some embodiments, p-type organic and/or inorganic nanoparticles are present in the first carrier in an amount of 0.1 weight percent to 30 weight percent. In some alternative embodiments, a layer of the p-type nanoparticles is formed over the first carrier. In such embodiments, the first carrier serves as a support for the nanoparticle layer as opposed to a matrix in which the organic and/or inorganic nanoparticles are dispersed.

The first carrier can be an organic material, inorganic material or combinations thereof. For example, the first carrier can comprise one or more polymeric species. Suitable polymeric species can include one or more fluoropolymers. In some embodiments, the first carrier comprises polyvinylidene fluoride (PVDF), polyvinyl fluoride (PVF), polyvinylidene fluoride-trifluoroethylene (PVDF-TrFE), polyvinylidene fluoride-tetrafluoroethylene (PVDF-TFE), polytetrafluoroethylene (PTFE), or mixtures or copolymers thereof. Semicrystalline polymers of PVDF, PVDF-TFE and/or PVDF-TrFE used in p-type regions of the thin-film layer can demonstrate increased amounts of β-phase. For example, PVDF, PVDF-TFE and/or PVDF-TrFE of a p-type layer can display a phase ratio of β/α of 1.5 to 2.5. In some embodiments, the β/α phase ratio is 2 to 2.5. β-phase crystallites can be provided a non-random orientation by poling techniques, thereby enhancing piezoelectric and pyroelectric properties of the polymeric matrix.

Alternatively, the first carrier can comprise one or more elastomeric species, including polyisoprene, polyisobutylene and polysiloxanes, such as polydimethylsiloxane (PDMS). The first organic carrier can also comprise polyacrylic acid (PAA), polymethacrylate (PMA), polymethylmethacrylate (PMMA) or mixtures or copolymers thereof. Additionally, the first carrier can comprise polyolefin including, but not limited to polyethylene, polypropylene, polybutylene or mixtures or copolymers thereof.

Semiconducting polymers can also find application as the first carrier. Suitable semiconducting polymers can include phenylene vinylenes, such as poly(phenylene vinylene) and poly(p-phenylene vinylene) (PPV), and derivatives thereof. In some embodiments, semiconducting polymers comprise poly fluorenes, naphthalenes, and derivatives thereof. In other embodiments, semiconducting polymers comprise poly(2-vinylpyridine) (P2VP), polyamides, poly(N-vinylcarbazole) (PVCZ), polypyrrole (PPy), polyaniline (PAn) and poly[2,6-(4,4-bis-(2-ethylhexyl)-4H-cyclopenta[2,1-b;3,4-b']dithiophene)-alt-4,7-(2,1,3-benzothiadiazole)] (PCPDTBT).

Alternatively, in some embodiments, the first carrier is an inorganic carrier. Inorganic carriers, in some embodiments, include polycrystalline ceramics or other particulate inorganic materials.

N-type regions of the thermoelectric film can comprise conductive particles dispersed in or on a second carrier. Electrically conductive particles of the n-type regions can include n-type organic nanoparticles, n-type inorganic nanoparticles or mixtures thereof. In some embodiments, n-type nanoparticles are selected from the group consisting of nanotubes, nanowires, nanorods, platelets and sheets. The n-type nanoparticles can have a 1-dimensional or 2-dimensional structure, in some embodiments.

N-type organic nanoparticles can include carbon nanotubes, fullerenes, graphene or mixtures thereof. In some embodiments, lattice structures of the organic n-type nanoparticles include one or more dopants such as nitrogen. Alternatively, n-type dopant is externally applied to the organic nanoparticles by the environment surrounding the nanoparticles in the second carrier. For example, the second carrier can provide n-dopant to surfaces of the organic nanoparticles. Similarly, one or more n-dopant species, such as polyethyleneimine (PEI), can be dispersed in the second carrier for interaction with the organic nanoparticles.

N-type inorganic nanoparticles can include binary, ternary and quaternary semiconductors compositions formed from elements selected from Groups IB, IIB and IIIA-VIA of the Periodic Table. For example, n-type inorganic nanoparticles can be formed of $Bi_2Se_3$, $Bi_2Te_3$, $Bi_2Te_{3-x}Se_x$, $Sb_2Te_3$, $Sb_{2-x}Bi_xTe_3$, Cu doped $Bi_2Se_3$ and Ag surface modified $Bi_2Se_3$ and $Bi_2Te_3$. N-type inorganic nanoparticles can also be selected from various transition metal dichalcogenides, $MX_2$. In some embodiments, n-type transition metal dichalcogenides include $TiS_2$, $WS_2$ and $MoS_2$. Table II provides non-limiting examples of n-type inorganic nanoparticles and morphology.

TABLE II

N-type Inorganic Nanoparticles

| Nanoparticle Composition | Morphology |
| --- | --- |
| Cu doped $Bi_2Se_3$ | Platelets |
| $Bi_2Se_3$ | 2D plate |
| $Bi_2Te_3$ | 2D plate |
| $Bi_2Te_{3-x}Se_x$ | 2D plate |
| $Sb_2Te_3$ | 2D plate |
| $Sb_{2-x}Bi_xTe_3$ | 2D plate |
| $TiS_2$ | 2D plate |
| $WS_2$ | 2D plate |
| $MoS_2$ | 2D plate |

In some embodiments, n-dopant is externally applied to inorganic nanoparticles by the second carrier and/or one or more n-dopant species dispersed in the first organic carrier. As with the p-type inorganic nanoparticles, the n-type inorganic nanoparticles can lack sufficient thickness to exhibit any meaningful bulk properties. Therefore, n-dopant species externally applied to the inorganic nanoparticles can create the n-type character of the nanoparticles. Moreover, the inorganic nanoparticles of the n-type region can be selected from one or more topological insulators.

N-type organic nanoparticles and/or inorganic nanoparticles can be present in the second carrier in any amount not inconsistent with the objectives of the present invention. In some embodiments, n-type organic and/or inorganic nanoparticles are present in the second carrier in an amount of 0.1 weight percent to 30 weight percent. In some alternative embodiments, a layer of the n-type nanoparticles is formed over the second carrier. In such embodiments, the second carrier serves as a support for the nanoparticle layer as opposed to a matrix in which the organic and/or inorganic nanoparticles are dispersed.

The second carrier can be an organic material, inorganic material or combinations thereof. The second carrier can comprise any material operable to host or support n-type organic nanoparticles and/or n-type inorganic nanoparticles to provide a thin-film structure having n-type electronic structure. For example, the second carrier can comprise one or more polymeric species. Suitable polymeric species can include one or more fluoropolymers. In some embodiments, the second organic carrier comprises polyvinylidene fluoride (PVDF), polyvinyl fluoride (PVF), polyvinylidene fluoride-trifluoroethylene (PVDF-TrFE), polyvinylidene fluoride-tetrafluoroethylene (PVDF-TFE), polytetrafluoroethylene (PTFE), or mixtures or copolymers thereof. Semicrystalline polymers of PVDF, PVDF-TFE and/or PVDF-TrFE used in n-type regions of the thin-film layer can demonstrate increased amounts of β-phase. For example, PVDF, PVDF-TFE and/or PVDF-TrFE of a p-type layer can display a phase ratio of β/α of 1.5 to 2.5. In some embodiments, the β/α phase ratio is 2 to 2.5.

Alternatively, the second organic carrier can comprise one or more elastomeric species, including polyisoprene, polyisobutylene and polysiloxanes, such as polydimethylsiloxane (PDMS). The second organic carrier can also comprise polyacrylic acid (PAA), polymethacrylate (PMA), polymethylmethacrylate (PMMA) or mixtures or copolymers thereof. Additionally, the second organic carrier can comprise polyolefin including, but not limited to polyethylene, polypropylene, polybutylene or mixtures or copolymers thereof.

Semiconducting polymers can also find application as the second organic carrier. Suitable semiconducting polymers can include phenylene vinylenes, such as poly(phenylene vinylene) and poly(p-phenylene vinylene) (PPV), and derivatives thereof. In some embodiments, semiconducting polymers comprise poly fluorenes, naphthalenes, and derivatives thereof. In other embodiments, semiconducting polymers comprise poly(2-vinylpyridine) (P2VP), polyamides, poly(N-vinylcarbazole) (PVCZ), polypyrrole (PPy), polyaniline (PAn) and poly[2,6-(4,4-bis-(2-ethylhexyl)-4H-cyclopenta[2,1-b;3,4-b']dithiophene)-alt-4,7-(2,1,3-benzothiadiazole)] (PCPDTBT).

The second carrier can also be an inorganic material including, but not limited to, polycrystalline ceramics or other particulate inorganic materials.

As described herein, p-n junctions are established at interfaces of the p-type and n-type regions. Depending on construction of adjacent p-type and n-type regions, the interfaces can exhibit seams or be seamless. For example, the first carrier and second carrier can be formed of the same material, thereby providing a seamless interface between the p-type and n-type regions. Alternatively, the first carrier and second carrier are formed of differing materials providing a seam at the interface. The thermoelectric film can have any desired thickness not inconsistent with the objectives of the present invention. Thickness, for example, can be varied according to deposition methods and conditions and the amount of carriers employed. In some embodiments, the thermoelectric film has a thickness of 100 nm to 500 μm or 500 nm to 50 μm.

Individual p-type regions and n-type regions, in some embodiments, can be fabricated by dispersing the desired nanoparticles in a liquid phase including the organic carrier and cast into a thin-film segment. The individual p-type segments and n-type segments are laterally joined in fabrication of the single-layer thin film, wherein p-n junctions are established at interfaces between the p-type and n-type segments. In some embodiments, for example, the individual segments are solvent welded, wherein the solvent welding occurs at edges of the segments to maintain a lateral format. In other embodiments, individual segments can be joined by melting or other heat treatment techniques. Melting of the first and second organic carriers, for example, can be localized to interfacial regions between the p-type and n-type segments. In further embodiments, conductive adhesives can be employed to joint p-type and n-type segments.

In an alternative technique, a p-type segment is provided and selectively doped in at least one region to form an n-type segment. In some embodiments, multiple regions of the p-type segment are doped to provide n-type segments alternating with undoped regions of the p-type segment. Similarly, an n-type segment can be provided and selectively doped in at least one region to form a p-type segment. In some embodiments, multiple regions of the n-type segment are doped to provide p-type segments alternating with undoped regions of the n-type segment.

In a further technique, a thin-film is provided comprising inorganic nanoparticles in an organic carrier. The inorganic nanoparticles are sufficiently thin, permitting electronic properties of the nanoparticles to be dominated by surface interactions and/or behaviors. For example, the inorganic nanoparticles can be nanoplates having dimensions described herein. One or more p-type segments are formed by depositing p-dopant onto the thin-film in selected area(s). The p-dopant interacts with the inorganic nanoparticles, thereby providing the doped region p-type electronic structure. Similarly, one or more n-type regions can be aimed adjacent to the p-type regions by depositing n-dopant onto the thin-film. The n-dopant interacts with inorganic nanoparticles, thereby providing n-type electronic structure. For example, p-type and n-type dopants can be printed onto the thin-film layer to provide the lateral p-n junction architecture described herein. In such embodiments, the organic carrier of the inorganic nanoparticles prior to doping is the same for the p-type regions and the n-type regions enabling a seamless heterojunction structure.

In some embodiments, printing of dopant can permit the formation of various heterojunction architectures. For example, p-insulator-n junctions can be formed by spacing the printing of p-dopant and n-dopant. Moreover, p-metal-n junctions can be formed by providing a region between the p-type and n-type regions with sufficient dopant to render the electronic structure of the region metallic. In further embodiments, the p-type regions can exhibit varying levels of p-dopant, thereby producing dopant gradients. P-dopant gradients, for example, can be present within a single p-type region, such as a p/p−/p−− gradient across the p-type region. Alternatively, a p-dopant gradient can be established between separate p-type regions on the face of the thin film. Similarly, n-type regions can exhibit varying levels of n-dopant, thereby producing dopant gradients. N-dopant gradients can be present within a single n-type region, such as an n/n+/n++ gradient across the n-type region. Additionally, an n-dopant gradient can be established between separate n-type regions on the face of the film.

As described herein, piezoelectric film is coupled to the thermoelectric film. The piezoelectric film can be formed of organic material, inorganic material or various combinations thereof. The piezoelectric film, in some embodiments, comprises a polymeric material. A polymeric piezoelectric film can comprise semicrystalline polymer including, but not limited to, polyvinyl fluoride (PVF), polyvinylidene fluoride (PVDF), polyvinylidene fluoride-trifluoroethylene (PVDF-TrFE), polyvinylidene fluoride-tetrafluoroethylene (PVDF-TFE), polytetrafluoroethylene (PTFE), or mixtures or copolymers thereof. Semicrystalline polymers of PVDF, PVDF-TFE and/or PVDF-TrFE used in piezoelectric film of the electric generator can demonstrate increased amounts of β-phase. For example, PVDF, PVDF-TFE and/or PVDF-TrFE of an insulating layer can display a ratio of β/α of 1.5 to 2.5. In some embodiments, the β/α ratio is 2 to 2.5. As discussed herein, β-phase crystallites can be provided a non-random orientation by poling techniques, thereby enhancing piezoelectric and pyroelectric properties of the insulating layer. Alternatively, piezoelectric polymer can include polyamide or polyurea. In some embodiments, the piezoelectric film comprises nylon-11 or polyurea-9.

A polymeric piezoelectric film can further comprise particles demonstrating piezoelectric behavior. For example, a polymeric piezoelectric film can comprise particles of $BaTiO_3$, BiTe particles, other inorganic piezoelectric particles or mixtures thereof. The $BaTiO_3$ particles, BiTe particles and/or other inorganic particles can have any size and/or geometry not inconsistent with the objectives of the present invention. $BaTiO_3$ and BiTe particles can demonstrate a size distribution ranging from 20 nm to 500 nm. Further, piezoelectric particles can be dispersed in polymer of the piezoelectric layer at any loading not inconsistent with the objectives of the present invention. In some embodiments, $BaTiO_3$ particles, BiTe particles and/or other inorganic piezoelectric particles are nanoparticles are present in an piezoelectric film in an amount of 5-80 weight percent or 10-50 weight percent, based on the total weight of the piezoelectric film. As described herein, piezoelectric particles of the piezoelectric film can be electrically poled to further enhance the piezoelectric and/or pyroelectric properties of thermoelectric apparatus described herein.

Alternatively, the piezoelectric film can be formed of an inorganic or ceramic material. In some embodiments, the piezoelectric film is formed of metal oxide particles, including transition metal oxide particles. Suitable metal oxide particles can also demonstrate piezoelectric behavior. In one embodiment, for example, the piezoelectric film is formed of $BaTiO_3$ particles that can be electrically poled.

The piezoelectric film can have any desired thickness not inconsistent with the objectives of the present invention. In some embodiments, the piezoelectric film has a thickness of at least about 50 nm. The piezoelectric film, in some embodiments, has a thickness of at least about 500 nm or at least about 1 μm.

The piezoelectric film can have a face that is coextensive with a face of the thermoelectric film. Alternatively, a face of the piezoelectric film is not coextensive with a face of the thermoelectric film. Moreover, in some embodiments, the piezoelectric film and thermoelectric film employ the same polymer. For example, the piezoelectric film and thermoelectric film can employ the same fluoropolymer, such as PVDF or derivatives thereof. In such embodiments, a single fluoropolymer film can be used to provide the thermoelectric film and the piezoelectric film. For example, the fluoropolymer film can have sufficient thickness wherein lateral p-n junctions are formed at the surface of the film. The lateral p-n junction can be formed according to techniques described hereinabove. The lateral p-n junctions and surface regions of the fluoropolymer film serve as the thermoelectric film while the bulk of the fluoropolymer film serves as the piezoelectric film. Thickness of the fluoropolymer film can also be controlled to inhibit charge flow between the piezoelectric bulk and thermoelectric surface.

The electric generator also comprises an electrode coupled to the piezoelectric film or layer. The electrode can be fabricated from any material not inconsistent with the objectives of the present invention. The electrode, for example, can be metal, alloy or a semiconductor composition. As illustrated in FIG. 1(b), the electrode can be flexible for adopting a folded or corrugated orientation. In some embodiments, the electrode is coextensive with the piezoelectric layer. Alternatively, the electrode is not coextensive with the piezoelectric film and can be subdivided into smaller sections that are positioned directly above the p- and n-type junctions but do not extend to the next junction resulting in an electrode for each junction.

In some embodiments, adhesive layers can be employed between various films or layers of the electric generator. For example, one or more adhesive layers can be positioned between the thermoelectric film and piezoelectric film. Similarly, one or more adhesive layers can be positioned between the electrode and piezoelectric film. Adhesive layers can generally be formed of electrically insulating materials. In some embodiments, an adhesive layer is polyvinyl alcohol (PVA).

Further, the electric generator can be encased in of encapsulated by various materials to maintain the folded structure. Suitable materials include elastomers, such as polydimethylsiloxane (PDMS). The entire electric generator can be encased or only portions encased. In some embodiments, encasing material can be used to establish or enhance thermal gradients, thereby increasing thermoelectric performance of the electric generator. For example, a bottom portion of the electric generator can be encased in a thermally insulating material wherein the top portion is not encased or is encased in a thermally conductive material. Such an arrangement enhances the thermal gradient along the thickness of the electric generator.

These and other features are further illustrated by the following non-limiting examples.

Example 1—Electric Generator (TPEG)

An electric generator according to some embodiments described herein was fabricated as follows.

Thermoelectric films were prepared via solution dropcasting. Acid cleaned single-walled/double walled carbon nanotubes were used as distributed by Cheap Tubes Inc. N,N-Dimethylformide (DMF) ACS reagent 99.8% (Sigma-Aldrich) was used to disperse the CNTs. The CNT matrix was held together with a nonconductive polymer PVDF M.W. 534,000 (Aldrich Chemistry) in a 15/85 weight percent of CNT/PVDF. The resulting p-type film was then selectively doped n-type using polyethyleneimine (PEI), branded, M.W. 600 99% (Alfa Aeser) by a spray doping method. The spray doping technique deposited PEI in DMF on the film surface to dissolve the surrounding PVDF matrix and allowed the small molecule dopant to integrate into the continuous p-type thermoelectric film creating alternating p-type and n-type sections. This synthesis technique allowed for a continuous electrode to double as a TEG. The resulting TEG film was comprised of alternating p-type and n-type sections 10 mm long. The piezoelectric films used were uni-axially oriented piezoelectric PVDF films manufactured by Good Fellows Inc. (FV301251). Finally, to adhere the bottom 18 mm×110 mm TEG electrode to the 20 mm×100 mm PEG, a water soluble plastic Poly(vinyl Alcohol) (PVA) (Aldrich Chemistry) was used as an adhesive. 120 µL of 100 mg/mL of PVA in deionized water was dropcasted and the films were pressed together. The top 18 mm×98 mm CNT/PVDF electrode was then adhered using the same process. The system was dried at 60° C. for 120-180 minutes. The structure was then folded and metal contacts attached to the top and bottom electrodes for measurements, and the whole structure was finally incased in polydimethylsiloxane (PDMS) (Sylgard 184 Dow Corning).

Voltages were measured using Keithley 2000 multimeters and processed using LabVIEW. A thermal gradient was introduced by a bottom contact hot block and measured using a k-type thermocouple. A stress was applied to the top of the device using a preloaded harmonic-oscillating spring-mass system.

Figure 2B:
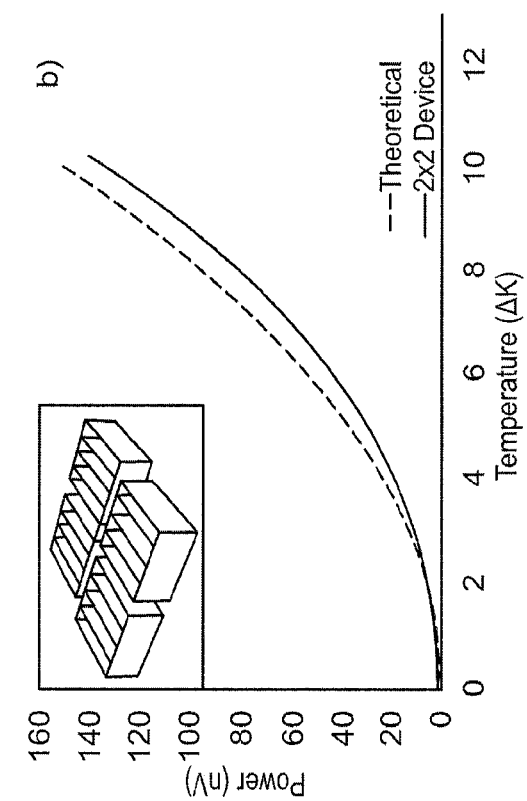
FIG. 2(b) illustrates thermal power generated by a 2×2 array of electric generators described herein with internal load matching compared to the theoretical maximum.
Figure 2A:
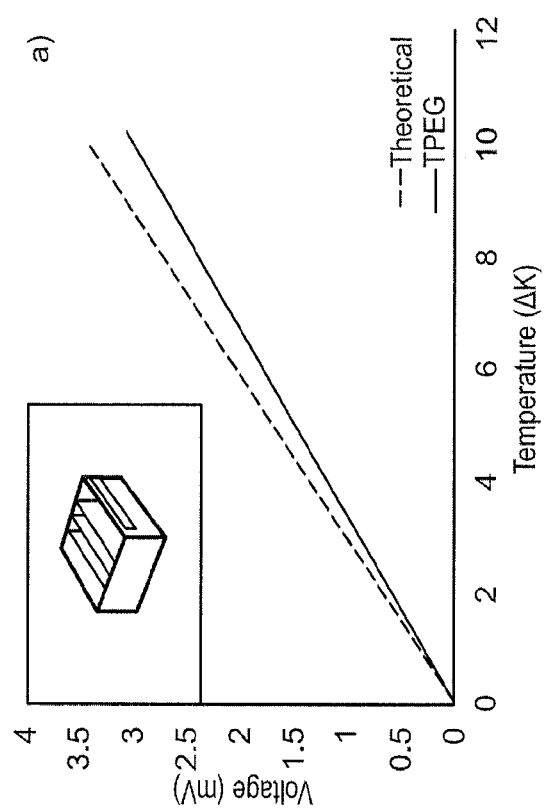
FIG. 2(a) illustrates thermoelectric voltage generated by an electric generator described herein compared with the theoretic maximum based on intrinsic thermoelectric values.

FIG. 2 shows the thermoelectric performance output of the TPEG. Given the linear thermoelectric relationship $V=\alpha\Delta T$; where V is the voltage, $\alpha$ is the Seebeck coefficient, and $\Delta T$ is the temperature gradient, one can calculate the effective Seebeck coefficient of the TPEG device. With six p- and n-type elements each with Seebeck coefficients of 30 µV/K and −27 µV/K, respectively, the effective Seebeck coefficient for the TPEG devices presented is 302±14 µV/K. Therefore, the measured thermoelectric voltage generated by the TPEG was approximately 88% of the intrinsic values for these thermoelectric elements. The power generated for a 2×2 device array at a thermal gradient of 10$\Delta$K is 140 nW which was 89% of the theoretical value. The 11% decrease in measured power versus theoretical output is a result of the fraction of the total measured $\Delta T$ that is dropped across the PDMS substrate. The folding of the TPEG structure allows for the TEG component to couple optimally with the heat source with minimal loss in performance. Additionally, the TPEG structure allows for power to scale with an array of devices.

Figure 3A:
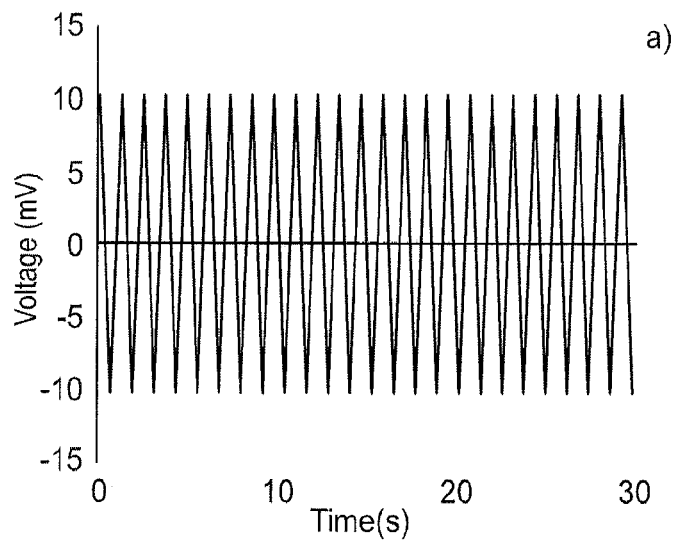
FIG. 3(a) illustrates voltage generated by a single electric generator while undergoing harmonic stress according to some embodiments.
Figure 3B:
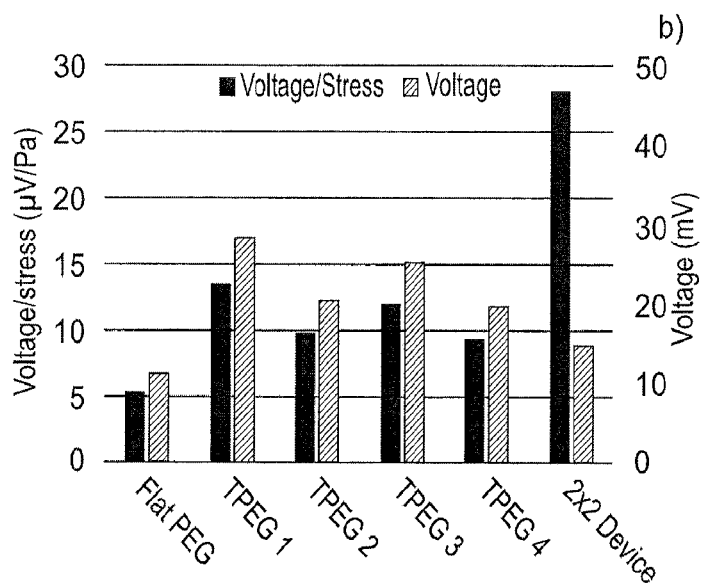
FIG. 3(b) illustrates the ratio between the measured peak-to-peak voltage and input stress according to some embodiments.

Finally, the folded meta-structure provided a unique improvement in output voltage of the piezoelectric contribution. The piezoelectric coefficient $d_{im}=dD_i/d\sigma_m$ quantifies the change in displacement field, $D_i$, due to the change in stress, $\sigma_m$. For a linear stress input, only one piezoelectric coefficient contributes to the change in displacement field in flat PEG systems. However, for the TPEG system, an external linear stress on the top surface of the elastomer results in a complex combination of stress components applied internally to the folded piezoelectric film. Given that the folded piezoelectric film in the TPEG device can have compressive and shear strains it is non-trivial to break the voltage signal up into the respective contributions. However, by comparing the measured voltage difference between a TPEG and a flat PEG device given the same linear stress one can show the effects of folding the piezoelectric film on the performance of the TPEG device. FIG. 3(a) shows the piezoelectric voltage generated by a harmonic oscillation of a pre-loaded spring-mass system. Because of the stability in the piezoelectric signal, the peak-to-peak voltage can be easily calculated and reproduced. The solid bars in FIG. 3(b) shows the ratio between the measured peak-to-peak voltage and input stress. The striped bars in FIG. 3(b) were the measured voltages. 11.1 µV/Pa was the average voltage to stress ratio for the TPEG devices versus 5.49 µV/Pa for a flat PEG device. This meant that by folding the piezoelectric film it generated twice as much voltage for the same input stress. A 2×2 TPEG array generated 28.0 µV/Pa. By connecting multiple devices together the output voltage is 5.3 time larger than a flat PEG device.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:
1. An electric generator comprising:
    a thermoelectric film having a plurality of lateral p-n junctions across a face of the film, the lateral p-n junctions established at interfaces between p-type regions and n-type regions;

a piezoelectric film coupled to the thermoelectric film; and an electrode coupled to the piezoelectric film wherein the p-type regions comprise electrically conductive particles dispersed in or on a first carrier and the n-type regions comprise electrically conductive particles dispersed in or on a second carrier and wherein the thermoelectric film is folded at the p-n junctions to form a corrugated structure.

2. The electric generator of claim 1, wherein the electrically conductive particles of the p-type regions comprise p-type organic nanoparticles, p-type inorganic nanoparticles or mixtures thereof.

3. The electric generator of claim 2, wherein the p-type organic nanoparticles and p-type inorganic nanoparticles are selected from the group consisting of nanotubes, nanowires, platelets and sheets.

4. The electric generator of claim 1, wherein the electrically conductive particles of the n-type regions comprise n-type organic nanoparticles, n-type inorganic nanoparticles or mixtures thereof.

5. The electric generator of claim 4, wherein the n-type organic nanoparticles and n-type inorganic nanoparticles are selected from the group consisting of nanotubes, nanowires, platelets and sheets.

6. The electric generator of claim 1, wherein the first carrier comprises one or more polymeric species.

7. The electric generator of claim 6, wherein the first carrier comprises a fluoropolymer.

8. The electric generator of claim 7, wherein the fluoropolymer comprises polyvinylfluoride, polyvinylidene fluoride, polyvinylidene fluoride-trifluoroethylene, polyvinylidene fluoride-tetrafluoroethylene or mixtures thereof.

9. The electric generator of claim 1, wherein the second carrier comprises one or more polymeric species.

10. The electric generator of claim 9, wherein the second carrier comprises a fluoropolymer.

11. The electric generator of claim 10, wherein the fluoropolymer comprises polyvinylfluoride, polyvinylidene fluoride, polyvinylidene fluoride-trifluoroethylene, polyvinylidene fluoride-tetrafluoroethylene or mixtures thereof.

12. The electric generator of claim 1, wherein the piezoelectric film comprises fluoropolymer.

13. The electric generator of claim 12, wherein the fluoropolymer comprises polyvinylfluoride, polyvinylidene fluoride, polyvinylidene fluoride-trifluoroethylene, polyvinylidene fluoride-tetrafluoroethylene or mixtures thereof.

14. The electric generator of claim 1, wherein the piezoelectric film comprises polyamide or polyurea.

15. The electric generator of claim 1, wherein the piezoelectric film comprises ceramic.

16. The electric generator of claim 15, wherein the ceramic comprises metal oxide particles.

17. The electric generator of claim 1, wherein the electrode comprises a metal, alloy or semiconducting material.

18. The electric generator of claim 1, wherein a face of the thermoelectric film is coextensive with a face of the piezoelectric film.

19. The electric generator of claim 1 further comprising one or more adhesive layers between the thermoelectric film and piezoelectric film.

20. The electric generator of claim 1 further comprising one or more adhesive layers between the piezoelectric film and electrode.

21. The electric generator of claim 1, wherein the piezoelectric film is positioned between the electrode and thermoelectric film.

* * * * *